United States Patent
Yang et al.

(10) Patent No.: US 6,403,211 B1
(45) Date of Patent: Jun. 11, 2002

(54) LIQUID CRYSTAL POLYMER FOR FLEXIBLE CIRCUITS

(75) Inventors: Rui Yang, Austin, TX (US); Guoping Mao, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/618,753

(22) Filed: Jul. 18, 2000

(51) Int. Cl.⁷ .............................. B32B 5/14; B31D 3/00
(52) U.S. Cl. ................. 428/308.4; 428/304.4; 428/314.2; 428/315.7; 216/56
(58) Field of Search ............... 428/304.4, 308.4, 428/314.2, 315.7; 252/79.5; 216/56

(56) References Cited

U.S. PATENT DOCUMENTS

| | | | |
|---|---|---|---|
| 4,975,312 A | 12/1990 | Lusignea et al. ............ | 428/209 |
| 4,995,941 A | * 2/1991 | Nelson et al. ............... | 156/630 |
| 5,066,545 A | 11/1991 | Walsh ......................... | 428/626 |
| 5,614,114 A | 3/1997 | Owen ....................... | 219/121.66 |
| 5,891,528 A | * 4/1999 | Turek et al. ................ | 427/448 |

FOREIGN PATENT DOCUMENTS

| | | | |
|---|---|---|---|
| EP | 0 507 332 A2 | 10/1992 | ............ B32B/15/08 |
| EP | 0 614 328 A1 | 9/1994 | ............ H05K/3/46 |
| EP | 0 697 278 A1 | 2/1996 | ............ B32B/15/08 |
| EP | 0832918 A1 | 4/1998 | ............... C08J/7/12 |

OTHER PUBLICATIONS

YFLEX™–High density, multi-layered flexible circuit.
Yamaichi Electronics—Flexible Printed Circuit.

* cited by examiner

*Primary Examiner*—Blaine Copenheaver
*Assistant Examiner*—Hai Vo
(74) *Attorney, Agent, or Firm*—Alan Ball; Gerald F. Chernivec; Gary L. Griswold

(57) ABSTRACT

A flexible circuit comprising a liquid crystal polymer film having through-holes and related shaped voids formed therein using an etchant composition comprising a solution in water of from about 35 wt. % to about 55 wt. % of an alkali metal salt; and from about 10 wt. % to about 35 wt. % of a solubilizer dissolved in the solution to provide the etchant composition suitable for etching the liquid crystal polymer at a temperature from about 50° C. to about 120° C.

16 Claims, No Drawings

LIQUID CRYSTAL POLYMER FOR FLEXIBLE CIRCUITS

FIELD OF THE INVENTION

The invention relates to low dielectric constant films suitable for use in flexible circuit applications and more particularly to chemical etching of flexible composites including liquid crystal polymer (LCP) films.

BACKGROUND OF THE INVENTION

An etched copper or printed polymer thick film circuit pattern over a polymer film base may be referred to as a flexible circuit or flexible printed wiring. As the name suggests, flexible circuitry can move, bend and twist without damaging the conductors to permit conformity to different shapes and unique package sizes. Originally designed to replace bulky wiring harnesses, flexible circuitry is often the only solution for the miniaturization and movement needed for current, cutting-edge electronic assemblies. Thin, lightweight and ideal for complicated devices, flexible circuit design solutions range from single-sided conductive paths to complex, multilayer three-dimensional packages.

Commonly used dielectric film base materials for flexible electronic packaging include polyimide, polyester terephthalate, random-fiber aramid and polyvinyl chloride. Changes in electronic device design create the need for new materials with properties surpassing the electrical performance and processing capabilities of the substrates listed previously. For example, a lower dielectric constant allows faster electrical signal transfer, good thermal performance facilitates cooling for a package, a higher glass transition or melting temperature improves package performance at higher temperature, and lower moisture absorption leads to signal and data processing at higher and higher frequencies.

Polyimide film is a commonly used substrate for flexible circuits that fulfil the requirements of complex, cutting-edge electronic assemblies. The film has excellent properties such as thermal stability and low dielectric constant, but represents a limiting factor to additional gain in the speed or frequency at which electronic components may operate. A major drawback to further progress using polyimide film relates to the way in which polyimide absorbs moisture to levels that interfere with high frequency device performance. Higher frequency operation will require the identification or development of substrate materials with less susceptibility to moisture absorption.

Liquid crystal polymer (LCP) films represent suitable materials as substrates for flexible circuits having improved high frequency performance. Generally they have lower dielectric loss, and absorb less moisture than polyimide films. These beneficial properties of liquid crystal polymers were known previously but difficulties with processing prevented application of liquid crystal polymers to complex electronic assemblies.

The development of multiaxial, e.g. biaxial, film processing techniques expanded the use of liquid crystal polymer film for flexible circuit applications. U.S. Pat. No. 4,975,312 describes a printed wiring board substrate prepared from a multiaxially oriented thermotropic liquid crystalline polymer film having a tailored coefficient of thermal expansion in the X-Y direction and a thickness of not more than about 100 $\mu$m. Materials of this type offer several potential advantages over polyimide films as flex circuit substrates. Such potential advantages led to the use of readily available processing techniques for producing single layer or multilayer circuit structures supported by one or more layers of a liquid crystal film substrate. A multilayer flexible circuit is a combination of three or more layers of single or double-sided flexible circuits laminated together and processed with drill and plating to form plated through-holes. This creates conductive paths between the various layers without having to use multiple soldering operations.

Reference to drilling for the formation of through-holes reflects the emphasis on physical methods such as mechanical drilling, punching, laser ablation and plasma drilling for via and related circuit feature formation in liquid crystal polymer films. An alternative to conventional drilling and related techniques for hole formation in flexible circuit substrates was introduced as Y-FLEX™ by Yamaichi Corporation. Information describing Y-FLEX™ presents it as a microvia flexible wiring board using LCP resin insulation material and employing an internal conductive bump layer connection. Interconnection of Y-FLEX™ multilayer circuits occurs by conductive bumps penetrating through insluating LCP layers without the need for through-holes.

Although the several physical methods outlined above produce holes and related shaped voids in LCP, there are no reports of chemical methods for producing flexible circuits using liquid crytalline polymer substrates. Chemical etchant solutions for polyimide substrates are well known for production of polyimide-based flexible circuits. However, as shown in European Patent Application No. EP 0832918 A1, there is no single etchant composition capable of effecting development of circuit features in all types of polyimide. It appears that selection of etchant solutions depends upon the materials used for preparing a specified polyimide. Also aqueous developable photoresists disintegrate under the vigorous attack of etchant compositions described in the published application (EP 0832918).

Having less solubility than polyimide films, liquid crystal polymer films cannot be processed effectively using in-line chemical systems and known etchant compositions. There are no reports of chemically etching liquid crystal polymer films to form through holes. Chemical etching to form through holes is advantageous because it leads to the formation of unsupported or cantilevered lead structures which cannot be produced by conventional physical methods.

Since some steps of physical drilling and related processes tend to involve expensive equipment, set apart from the main flex circuit production line, there is a need for a more cost effective method for producing flexible circuits using liquid crystal polymer substrates. A further benefit would be the provision of flexible circuits including unsupported leads.

SUMMARY OF THE INVENTION

The present invention provides an aqueous-based chemical solution for controllable etching of through-holes and other shaped voids in films comprising liquid crystal polymers (LCP) as flexible circuit substrates. LCP films may be etched at rates exceeding those currently attainable with Kapton polyimide film. This results from adjusting the composition of the chemical etch solution. The new etchant makes possible the alternative use of LCP film to replace polyimide as an etchable substrate for flex circuit manufacture, especially high performance flex circuits. Chemically etched LCP flexible circuits will meet the needs of more sophisticated electronic assemblies, satisfying new opportunities that exist beyond the capabilities of polyimide and LCP film processed using drilling, laser ablation and related conventional physical methods.

The highly alkaline developing solution, referred to herein as an etchant, comprises an alkali metal salt and a solubilizer. A solution of an alkali metal salt alone may be used as an etchant for polyimide but is ineffective for developing LCP in the absence of the solubilizer. Typically the solubilizer is an amine compound preferably an alkanolamine. The efficacy of an amine in an etchant solution according to the present invention depends upon its use with a relatively narrow range of concentrations of alkali metal salts including an alkali metal hydroxide particularly potassium hydroxide. This suggests that there is a dual mechanism at work for developing flex circuits based upon liquid crystal polymers, i.e. the amine acts as a solubilizer for the LCP but preferably within a limited range of concentrations of alkali metal salt in aqueous solution. Discovery of a limited range of etchant solutions allows the manufacture of flexible printed circuits having finely structured features previously unattainable using current methods, of drilling, punching or laser ablation. The use of aqueous etchant solutions and methods according to the present invention produced flexible circuits including unsupported leads (also known as cantilevered leads) and vias with angled sidewalls which cannot be achieved using the previously mentioned physical methods.

More particularly the present invention provides an etchant composition for a liquid crystal. The etchant composition comprises a solution in water of from about 35wt. % to about 55wt. % of an alkali metal salt, and from about 10 wt. % to about 35wt. % of a solubilizer dissolved in the solution to provide the etchant composition suitable for etching the liquid crystal polymer at a temperature from about 50° C. to about 120° C.

Liquid crystal polymers may be etched with etchant compositions according to the present invention to provide a flexible circuit comprising a liquid crystal polymer film having through-holes and related shaped voids formed therein using an etchant composition comprising a solution in water of from about 35wt. % to about 55wt. % of an alkali metal salt; and from about 10 wt. % to about 35wt. % of a solubilizer dissolved in the solution to provide the etchant composition suitable for etching the liquid crystal polymer at a temperature from about 50° C. to about 120° C.

The invention also includes a process for etching a pattern in a liquid crystal polymer. Suitable process steps include, providing a liquid crystal polymer; applying a layer of photoresist to the liquid crystal polymer; exposing the photoresist to a pattern of radiation to crosslink portions of the photoresist exposed to the radiation and using a developer solution to remove unexposed photoresist. This exposes portions of the liquid crystal polymer which may be etched by contact, at a temperature from about 50° C. to about 120° C., with an etchant composition comprising a solution in water of from about 35wt. % to about 55wt. % of an alkali metal salt; and from about 10 wt. % to about 35wt. % of a solubilizer dissolved in the solution. The etchant composition etches previously unexposed portions of the liquid crystal polymer, either by immersion in the etchant or using spray etching techniques.

As used herein all amounts included as percentages refer to weight percent of a designated component.

DETAILED DESCRIPTION OF THE INVENTION

The present invention provides a film substrate for flexible circuits capable of operating at higher frequencies than currently available flex circuit substrates, particularly polyimide films such as KAPTON™ and APICAL™. Attainment of higher frequency performance, in response to the demand for faster electronic devices, results from the gradual development of methods for processing liquid crystal polymers that were once considered to be relatively intractable. A process development, described in U.S. Pat. No. 4,975,312, provided multiaxially (e.g. biaxially) oriented thermotropic polymer films of commercially available liquid crystal polymers (LCP) identified by the brand-names VECTRA® (naphthaline based, available from Hoechst Celanese Corp.) and XYDAR® (biphenol based, available from Amoco Performance Products). Multiaxially oriented LCP films of this type represent suitable substrates for flexible printed circuits and circuit interconnects. Characteristics of LCP films include electrical insulation, moisture absorption less than 0.5% at saturation, a coefficient of thermal expansion approaching that of the copper used for plated through holes, and a dielectric constant not to exceed 3.5 over the functional frequency range of 1 kHz to 45 GHz.

The development of multiaxially oriented LCP films, while providing a film substrate for flexible circuits, was subject to limitations in methods for forming such flexible circuits. An important limitation was the lack of a chemical etch method for use with LCP. Without this technique, complex circuit structures such as unsupported, cantilevered leads or through holes or vias having angled sidewalls cannot be included in a printed circuit design.

Advancements according to the present invention now provide an aqueous-based chemical solution for controllable etching of unsupported leads, through- holes with angled sidewalls, and other shaped voids in films comprising multiaxially oriented, thermotropic, liquid crystal polymers as flexible circuit substrates. After processing by chemical etching, flexible circuits using LCP film substrates possess all of the benefits of similarly processed polyimide films with the additional benefits of higher frequency operation along with, and because of, lower moisture absorption.

Flexible circuit structures according to the present invention result from etching a LCP polymer film during contact of the film with an aqueous alkaline etchant at a temperature of from about 50° C. (122° F.) to about 120° C. (248° F.). The formation of unsupported leads, through holes and other circuit features in the LCP film requires protection of portions of the polymeric film using a mask of a photo-crosslinked negative acting, aqueous processible photoresist. During the etching process the photoresist exhibits substantially no swelling or delamination from the LCP polymer film.

Negative photoresists suitable for use with liquid crystal polymers according to the present invention include negative acting, aqueous developable, photopolymer compositions such as those disclosed in U.S. Pat. Nos. 3,469,982, 3,448,098, 3,867,153, and 3,526,504. Such photoresists include at least a polymer matrix including crosslinkable monomers and a photoinitiator. Polymers typically used in photoresists include copolymers of methyl methacrylate, ethyl acrylate and acrylic acid, copolymers of styrene and maleic anhydride isobutyl ester and the like. Crosslinkable monomers may be multiacrylates such as trimethylol propane triacrylate.

Commercially available aqueous base, e.g. sodium carbonate developable, negative acting photoresists employed according to the present invention include polymethylmethacrylates such as RISTON photoresist materials e.g. RISTON 4720 available from duPont de Nemours and Co. Other useful examples include AP850 available from LeaRonal Inc. and PHOTEC HU350 available from Hitachi Chemical Co. Ltd. Photoresist compositions using the tradename AQUAMER are available from Hercules Inc. There are several series of AQUAMER photoresists including the "SF" and "CF" series with SF120, SF125, and CF2.0 being representative of these materials.

Polyimide films may be etched using solutions of potassium hydroxide alone, as described in mutually owned U.S. Pat. No. 5,227,008. However, liquid crystal polymers are unaffected by potassium hydroxide and require highly alkaline aqueous etchant solutions according to the present invention comprising water soluble salts of alkali metals and ammonia combined with a solubilizer for the LCP film. Suitable water soluble salts include potassium hydroxide (KOH), sodium hydroxide (NaOH), substituted ammonium hydroxides, such as tetramethylammonium hydroxide and ammonium hydroxide. Bases with low water solubility such as lithium hydroxide, aluminum hydroxide, and calcium hydroxide are not useful in processes of the invention due to solution saturation below useful concentrations. Useful concentrations of the etchant solutions vary depending upon the thickness of the LCP film to be etched, as well as the type and thickness of the photoresist chosen. Typical useful concentrations range from about 35wt. % to 55wt. %, preferably from about 40wt. % to about 50wt. % of a suitable salt and from about 10 wt. % to about 35wt. %, preferably from about 15wt. % to about 30wt. % of a solubilizer. The use of KOH is preferred for producing a highly alkaline solution since KOH-containing etchants provide optimally etched features in the shortest amount of time. One highly preferred embodiment, uses potassium hydroxide at a concentration of from about 43wt. % to about 48wt. %.

Solubilizers for etchant solutions according to the present invention may be selected from the group consisting of amines, including ethylene diamine, propylene diamine and the like, and alkanolamines such as ethanolamine, propanolamine and the like. Under the conditions of etching, unmasked areas of an LCP film substrate become soluble by action of the solubilizer in the presence of a sufficiently concentrated aqueous solution of e.g. an alkali metal salt. The time required for etching depends upon the type and thickness of the film to be etched and is typically from about 30 seconds to about 10 minutes. Using a preferred etchant solution, of concentrated KOH and ethanolamine, the etching time for a 50 $\mu$m (2.0 mil) LCP film is from about 30 seconds to about 240 seconds. The etching solution is generally at a temperature of from about 50° C. (122° F.) to about 120° C. (248° F.) preferably from about 70° C. (160° F.) to about 95° C. (200° F.).

The present invention allows change in the contour of through holes, vias and blind vias depending upon the concentration of solubilizer in the etchant and the temperature of etching. A solution of etchant containing 10 wt. % to 15wt. % ethanolamine provides a through hole angle of about 25° to about 35° while ethanolamine concentration of 15wt. % to 30wt. % in the etchant solution provides a through hole side-wall angle of about 35° to about 45°. The side-wall angle also changes with alkali metal hydroxide concentration in the etchant solution, such that over the concentration range of from about 35wt. % KOH to about 55wt. % KOH the angle of the side-wall changes from about 25° to about 55°. Modification of the angle of the side-wall is not possible using drilling, punching or laser ablation. In these latter cases, the walls of through holes are substantially parallel.

The manufacture of flexible circuits according to the present invention comprises the step of etching which may be used in conjunction with various known pre-etching and post-etching procedures. The sequence of such procedures may be varied as desired for the particular application. A typical sequence of steps may be described as follows:

The aqueous processible photoresists are laminated over both sides of a substrate having a polymeric film side and a copper side (available from W. L. Gore and Assoc. of Japan and Kuraray Corp. of Japan), using standard laminating techniques. Typically, the substrate has a polymeric film layer of from about 25 $\mu$m to about 125 $\mu$m, with the copper layer being from about 1 to about 5 $\mu$m thick.

The thickness of the photoresist is from about 25 $\mu$m to about 50 $\mu$m. Upon imagewise exposure of both sides of the photoresist to ultraviolet light or the like, through a mask, the exposed portions of the photoresist become insoluble by crosslinking. The resist is then developed, by removal of unexposed polymer with a dilute aqueous solution, e.g., a 0.5–1.5% sodium carbonate solution, until desired patterns are obtained on both sides of the laminate. The copper side of the laminate is then further plated to desired thickness. Chemical etching of the LCP film then proceeds by placing the laminate in a bath of etchant solution, as previously described, at a temperature of from about 50° C. to about 120° C. to etch away portions of the LCP polymer not covered by the crosslinked resist. This exposes certain areas of the original thin copper layer. The resist is then stripped from both sides of the laminate in a 2–5% solution of an alkali metal hydroxide at from about 25° C. to about 80° C., preferably from about 25° C. to about 60° C. Subsequently, exposed portions of the original thin copper layer are etched using an etchant that does not harm the LCP film, e.g., PERMA-ETCH, available from Electrochemicals, Inc.

In an alternate process, the aqueous processible photoresists are laminated onto both sides of a substrate having a LCP film side and a copper side, using standard laminating techniques. The substrate consists of a polymeric film layer about 25 $\mu$m to about 125 $\mu$m thick with the copper layer being from about 9 $\mu$m to about 40 $\mu$m thick. The photoresist is then exposed on both sides to ultraviolet light or the like, through a suitable mask, crosslinking the exposed portions of the resist. The image is then developed with a dilute aqueous solution until desired patterns are obtained on both sides of the laminate. The copper layer is then etched to obtain circuitry, and portions of the polymeric layer thus become exposed. An additional layer of aqueous photoresist is then laminated over the first resist on the copper side and crosslinked by flood exposure to a radiation source in order to protect exposed polymeric film surface (on the copper side) from further etching. Areas of the polymeric film (on the film side) not covered by the crosslinked resist are then etched with the etchant solution containing an alkali metal salt and LCP solubilizer at a temperature of from about 70° C. to about 120° C., and the photoresists are then stripped from both sides with a dilute basic solution, as previously described.

To create finished products such as flexible circuits, interconnect bonding tape for "TAB" (tape automated bonding) processes, microflex circuits, and the like, conventional processing may be used to add multiple layers and plate areas of copper with gold, tin, or nickel for subsequent soldering procedures and the like as required for reliable device interconnection.

The following examples are meant to be illustrative and are not intended to limit the scope of the invention which is expressed solely by the claims.

EXPERIMENTAL

Experiments were conducted with three LCP materials described as follows:

Film A—a LCP/copper laminate (W. L. Gore and Associates of Japan).

Film B—a LCP/copper laminate K-CT (Kuraray Corporation of Japan).

Film C—a LCP/copper laminate R-OC (Kuraray Corporation of Japan).

The etching rate of liquid crystal polymers was estimated by determining the time required to dissolve a film of a selected polymer in an etchant solution. Film A was further tested for etching performance of circuit features using resist coated film. Etchant solution performance was visually assessed using a ranking scheme wherein 1=Satisfactory etching and appearance.

3=Marginal performance or attack of the resist.

5=Unsatisfactory performance

Etchant Solutions

Table 1 shows the compositions of etchant solutions 1–6 suitable, according to the present invention, for effectively etching liquid crystal polymer films as well as compositions C1–C6 that generally do not satisfy requirements for liquid crystal film etching.

TABLE 1

Etchant Solution Compositions 1–8 and C1–C6

| Etchant Solution | Composition - wt. % <br> % EA*/% KOH/% Water |
|---|---|
| 1 | 20/40/40 |
| 2 | 33/40/27 |
| 3 | 10/45/45 |
| 4 | 20/45/35 |
| 5 | 19.3/48.2/32.5 |
| 6 | 10/50/50 |
| 7 | 20/38/42 |
| 8 | 15/44.7/40.3 |
| C1 | 21.9/31.2/46.9 |
| C2 | 33/33/34 |
| C3 | 15.7/33.7/50.6 |
| C4 | 17.6/35.6/45.8 |
| C5 | 0/40/60 |
| C6 | 0/50/50 |

*EA = Ethanolamine KOH = Potassium Hydroxide

Testing Conditions for Liquid Crystal Polymer Film Solubility in Etchant Solutions Samples of 50 μm (2.0 mil) thick liquid crystal polymer film, 1 cm×1 cm square, were submerged in etchant solutions contained in an etchant bath. The temperature of the etchant was maintained at 85° C. and the time was recorded for dissolution of film samples in the etchant solutions shown in Table 1. Times exceeding about 10 minutes indicate poor etchant performance. Although some etchant mixtures rapidly dissolved the liquid crystal polymer samples, they did not perform well when the liquid crystal polymer was coated with an aqueous developable film resist material (see Table 2 solutions C1–C4).

Testing Conditions for Resist Coated Liquid Crystal Polymer Film

Two layers of 50 μm thick aqueous resists, available from DuPont under the tradename Riston™ 4720, were laminated with heated rubber rolls to a flexible substrate consisting of 50 μm (2.0 mil) of LCP film on one side and copper on the other. The laminate was then exposed with ultraviolet (UV) light through a phototool or mask on each side and developed with 0.75% aqueous solution of sodium carbonate on both sides to obtain desired image of circuitry. Copper was then plated on the copper side of the laminate to 35 μm in thickness. The LCP side was then etched by dipping into an etchant bath containing one of the compositions listed in Table 1. The temperature of the etchant bath was controlled at 85° C. (185° F.). Each resist was then washed with water, and the resist was stripped with 2.5% KOH at 25° C. to 85° C. The condition of etched films was evaluated to performance with Film A as recorded in Table 2.

TABLE 2

Solution and Etching Times for Film A

| Etchant Solution | LCP Film | Time (min) Film Only | Time (min) + Resist | Etchant Performance |
|---|---|---|---|---|
| 1 | A | 6.3 | 8.5 | 1 |
| 2 | A | 1.6 | 5.0 | 1 |
| 3 | A | 4.5 | 11.0 | 3 |
| 4 | A | 2.4 | 5.5 | 1 |
| 5 | A | 2.4 | — | 1 |
| 6 | A | 3.0 | 6.5 | 1 |
| 7 | A | — | 6.5 | 1 |
| 8 | A | — | 6.0 | 1 |
| C1 | A | 4.0 | 10 | 5 |
| C2 | A | 2.7 | 6.5 | 3 |
| C3 | A | 5.2 | 10.0 | 5 |
| C4 | A | 2.7 | 9.5 | 5 |
| C5 | A | 26.4 | — | 5 |
| C6 | A | 24.6 | — | 5 |

TABLE 3

Solution and Etching Times for Film B

| Etchant Solution | LCP Film | Time (min) Film Only | Etchant Performance |
|---|---|---|---|
| 2 | B | 3.2 | 1 |
| 3 | B | 5.5 | 1 |
| 4 | B | 5.0 | 1 |
| 6 | B | 2.2 | 1 |
| C1 | B | >35.0 | 5 |
| C2 | B | 14.2 | 5 |
| C3 | B | >35.0 | 5 |
| C4 | B | >30.0 | 5 |
| C5 | B | >72.0 | 5 |

TABLE 4

Solution and Etching Times for Film C

| Etchant Solution | LCP Film | Time (min) Film Only | Etchant Performance |
|---|---|---|---|
| 2 | C | 3.5 | 1 |
| 3 | C | 5.7 | 1 |
| 4 | C | 5.2 | 1 |
| 6 | C | 2.3 | 1 |
| C1 | C | >35.0 | 5 |
| C2 | C | >10.0 | 5 |
| C3 | C | >60.0 | 5 |
| C4 | C | >30.0 | 5 |
| C5 | C | >72.0 | 5 |

A flexible circuit comprising a liquid crystal polymer film having through-holes and related shaped voids formed therein at elevated temperature using an aqueous etchant solution has been described herein. It will be appreciated by those of skill in the art that, in light of the present disclosure, changes may be made to the embodiments disclosed herein without departing from the spirit and scope of the present invention.

What is claimed is:

1. A flexible circuit comprising:
   a liquid crystal polymer film having solubility in an etchant composition, at temperatures from about 50° C.

to about 120° C., said liquid crystal polymer film has through-holes and related shaped voids formed therein using said etchant composition comprising:
  a solution in water of from about 35 wt % to about 55 wt % of an alkali metal salt; and
  from about 10 wt % to about 35 wt % of a solubilizer dissolved in said solution.

2. A flexible circuit according to claim 1 said solution containing from about 40wt. % to about 50wt. % of said alkali metal salt.

3. A flexible circuit according to claim 1 said etchant composition containing from about 15wt. % to about 30wt. % of said solubilizer.

4. A flexible circuit according to claim 1 wherein said temperature is from about 70° C. to about 95° C.

5. A flexible circuit according to claim 1 wherein said alkali metal salt is selected from the group consisting of sodium hydroxide and potassium hydroxide.

6. A flexible circuit according to claim 1 wherein said solubilizer is ethanolamine.

7. A flexible circuit according to claim 1 wherein said liquid crystal polymer film has a thickness from about 25 $\mu$m to about 125 $\mu$m.

8. A flexible circuit according to claim 1 wherein said liquid crystal polymer film is a multiaxially oriented polymer film.

9. A flexible circuit according to claim 8 wherein said liquid crystal polymer film is a biaxially oriented polymer film.

10. A flexible circuit according to claim 1 including at least one unsupported cantilevered lead.

11. A flexible circuit according to claim 1 including at least one through hole having non-parallel angled sidewalls.

12. The flexible circuit of claim 11, wherein said angled sidewalls have an angle from about 25° to about 55°, said angle increasing with concentration of said alkali metal salt from about 35wt. % to about 55wt. % of said etchant.

13. The flexible circuit of claim 11, wherein said angled sidewalls have an angle from about 25° to about 35°, when said etchant contains from about 10 wt. % to about 15wt. % of said solubilizer, said angle increasing from about 35° to about 45° when said etchant contains from at out 15wt. % to about 30wt. % of said solubilizer.

14. A flexible circuit according to claim 1 wherein a through hole forms in said flexible circuit during contact with said etchant composition for a time of about 30 seconds to about 10 minutes.

15. A flexible circuit according to claim 14 wherein said time is from about 2 minutes to about 7.5 minutes.

16. A process for etching a pattern in a liquid crystal polymer comprising the steps of:
  providing a liquid crystal polymer;
  applying a layer of photoresist to said liquid crystal polymer;
  exposing the photoresist to a pattern of radiation to crosslink portions of the photoresist exposed to the radiation;
  removing unexposed photoresist using a developer solution to expose portions of said liquid crystal polymer; and
  contacting said liquid crystal polymer with an etchant composition comprising:
    a solution in water of from about 35wt. % to about 55wt. % of an alkali metal salt; and
    from about 10 wt. % to about 35wt. % of a solubilizer dissolved in said solution to provide said etchant composition for etching said portions of said liquid crystal polymer at a temperature from about 50° C. to about 120° C.

* * * * *

UNITED STATES PATENT AND TRADEMARK OFFICE
CERTIFICATE OF CORRECTION

PATENT NO. : 6,403,211 B1
DATED : June 11, 2002
INVENTOR(S) : Rui Yang and Guoping Mao It is certified that error appears in the above-identified patent and that said Letters Patent is hereby corrected as shown below:

<u>Column 2,</u>
Lines 18 and 19, at the end of line 18 and beginning of line 19, "insluating LCP layers" should read -- insulating LCP layers --.

<u>Column 8,</u>
Lines 4 and 5, "to performance with" should read -- to determine etchant performance with --.

<u>Column 10,</u>
Line 5, "from at out 15wt. %" should read -- from about 15wt. % --.

Signed and Sealed this

Fifth Day of August, 2003

JAMES E. ROGAN
*Director of the United States Patent and Trademark Office*